(12) United States Patent
Han

(10) Patent No.: US 7,120,067 B2
(45) Date of Patent: Oct. 10, 2006

(54) MEMORY WITH DATA LATCHING CIRCUIT INCLUDING A SELECTOR

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 24 days.

(21) Appl. No.: 11/079,726

(22) Filed: Mar. 14, 2005

(65) Prior Publication Data

US 2006/0203575 A1 Sep. 14, 2006

(51) Int. Cl.
*G11C 7/00* (2006.01)

(52) U.S. Cl. .................. 365/189.05; 365/193; 365/194

(58) Field of Classification Search ...................... None
See application file for complete search history.

(56) References Cited

U.S. PATENT DOCUMENTS

| | | | | |
|---|---|---|---|---|
| 5,948,083 A * | 9/1999 | Gervasi | ........................ | 710/62 |
| 6,064,625 A * | 5/2000 | Tomita | ........................ | 365/233 |
| 6,407,963 B1 * | 6/2002 | Sonoda et al. | ........... | 365/233.5 |
| 6,529,993 B1 | 3/2003 | Rogers et al. | | |
| 6,639,868 B1 * | 10/2003 | Kim et al. | .................... | 365/233 |
| 6,728,162 B1 * | 4/2004 | Lee et al. | .................... | 365/233 |
| 6,838,712 B1 * | 1/2005 | Stubbs | ........................ | 257/208 |
| 6,922,367 B1 * | 7/2005 | Morzano et al. | ............ | 365/193 |
| 6,950,370 B1 * | 9/2005 | Lee | ............................. | 365/233 |
| 7,031,205 B1 * | 4/2006 | Han et al. | .................... | 365/193 |
| 2005/0141331 A1 * | 6/2005 | Cho | ............................ | 365/233 |

* cited by examiner

*Primary Examiner*—Son Mai
(74) *Attorney, Agent, or Firm*—Dicke, Billig & Czaja, PLLC

(57) ABSTRACT

A circuit for latching data into a memory includes a receiver, a delay, and a selector. The receiver is configured for receiving a data signal, and the delay is configured to delay the data signal to provide a delayed data signal. The selector is configured to receive the delayed data signal, a data strobe signal, and an inverted data strobe signal and provide a first strobe signal and a second strobe signal in response to the delayed data signal, the data strobe signal, and the inverted data strobe signal. Rising edge data is latched into the memory in response to the first strobe signal and falling edge data is latched into the memory in response to the second strobe signal.

29 Claims, 4 Drawing Sheets

MEMORY WITH DATA LATCHING CIRCUIT INCLUDING A SELECTOR

BACKGROUND

One type of memory known in the art is Dynamic Random Access Memory (DRAM). DRAM includes at least one array of memory cells. DRAM uses a main clock signal and a data strobe signal (DQS) for addressing the array of memory cells and for executing commands within the memory. The clock signal is used as a reference for the timing of commands such as read and write operations, including address and control signals. The DQS signal is used as a reference to latch input data into the memory and output data into an external device. For a memory write operation, the DQS signal is typically a differential signal provided by a memory controller.

Input data presented on data pad or pins (DQs) is latched into the memory in response to rising and/or falling edges of the DQS signal. Data latched into the memory in response to a rising edge of the DQS signal is referred to as rising edge data, and data latched into the memory in response to a falling edge of the DQS signal is referred to as falling edge data. Input data on the DQs is typically input to a receiver, which compares the input data to a reference voltage (VREF) signal to provide an internal data signal. Therefore, the internal data signal is dependent on the VREF signal. The differential DQS signal is typically input to receivers that generate an internal DQS signal and an internal inverted DQS signal for latching the input data into the memory. Therefore, the internal DQS signal and internal inverted DQS signal are independent of the VREF signal. If the voltage of the VREF signal moves up or down, there is a shift in the propagation delay for the input data. This shift in the propagation delay may affect the setup and hold times of the DQs.

SUMMARY

One embodiment of the present invention provides a circuit for latching data into a memory. The circuit includes a receiver, a delay, and a selector. The receiver is configured for receiving a data signal, and the delay is configured to delay the data signal to provide a delayed data signal. The selector is configured to receive the delayed data signal, a data strobe signal, and an inverted data strobe signal and provide a first strobe signal and a second strobe signal in response to the delayed data signal, the data strobe signal, and the inverted data strobe signal. Rising edge data is latched into the memory in response to the first strobe signal and falling edge data is latched into the memory in response to the second strobe signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
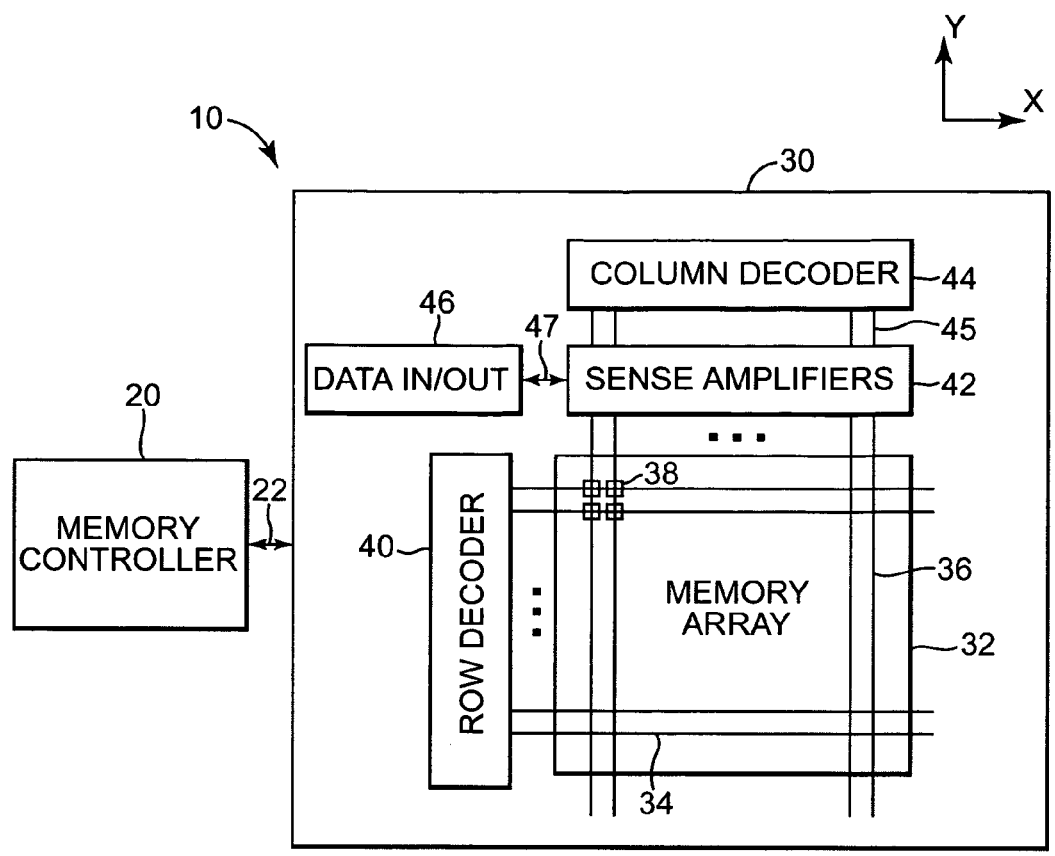
FIG. 1 is a block diagram illustrating one embodiment of a random access memory, according to the present invention.

FIG. 1 is a block diagram illustrating one embodiment of a random access memory 10. In one embodiment, random access memory 10 is a Dynamic Random Access Memory (DRAM). DRAM 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30 through communication link 22.

DRAM 10 is configured to latch input data into DRAM 10 using strobe signals generated from a data strobe (DQS) signal and an inverted DQS (bDQS) signal based on the polarity of the input data. Based on the input data polarity, either the DQS signal or the bDQS signal is used to generate a first strobe signal for latching rising edge data into the memory and a second strobe signal for latching falling edge data into the memory. There are four possible cases for generating the first strobe signal and the second strobe signal. The first and second cases relate to generating the first strobe signal for latching in rising edge data, and the third and fourth cases relate to generating the second strobe signal for latching in falling edge data.

For the first case, the input data is logic low and the following DQS signal is transitioning to logic high. In this case, the rising edge of the DQS signal is used to generate the first strobe signal to latch the input data. Therefore, if the input data transitions to logic high, both the input data and the first strobe signal come from rising edges. For the second case, the input data is logic high and the following DQS signal is transitioning to logic high. In this case, the falling edge of the bDQS signal is used to generate the first strobe signal to latch the input data. Therefore, if the input data transitions to logic low, both the input data and the first strobe signal come from falling edges.

For the third case, the input data is logic low and the following DQS signal is transitioning to logic low. In this case, the rising edge of the bDQS signal is used to generate the second strobe signal to latch the input data. Therefore, if the input data transitions to logic high, both the input data and the second strobe signal come from rising edges. For the fourth case, the input data is logic high and the following DQS signal is transitioning to logic low. In this case, the falling edge of the DQS signal is used to generate the second strobe signal to latch the input data. Therefore, if the input data transitions to logic low, both the input data and the second strobe signal come from falling edges.

Conductive word lines 34, referred to as row select lines, extend in the x-direction across the array of memory cells 32. Conductive bit lines 36 extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
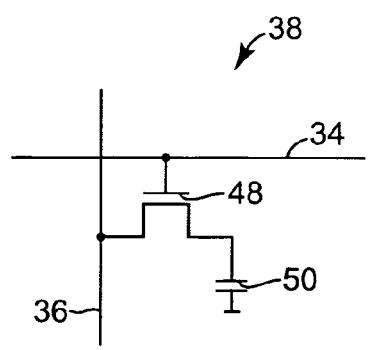
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic "0" or a logic "1." During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In one embodiment, random access memory 10 is a Double Data Rate Synchronous Dynamic Random Access Memory (DDR SDRAM). In DDR SDRAM, the read and write operations are synchronized to a system clock. The system clock is supplied by a host system that includes the DDR SDRAM. DDR SDRAM operates from a differential clock, CK and bCK. The crossing of CK going high and bCK going low is referred to as the positive edge of CK. Commands such as read and write operations, including address and control signals, are registered at the positive edge of CK. Operations are performed on both the rising and falling edges of the system clock.

The DDR SDRAM uses a double data rate architecture to achieve high-speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

Read and write accesses to the DDR SDRAM are burst oriented. Accesses start at a selected location and continue for a programmed number of locations in a programmed sequence. Accesses begin with the registration of an activate command, which is followed by a read or write command. The address bits registered coincident with the activate command are used to select the bank and row to be accessed. The address bits registered coincident with the read or write command are used to select the bank and the starting column location for the burst access.

The DDR SDRAM in the preceding description is referred to as DDR-I SDRAM for being the first generation of DDR SDRAM. The next generation of DDR SDRAM, DDR-II SDRAM, has the same features as DDR-I SDRAM except that the data rate is doubled. The DDR-II SDRAM architecture is essentially a 4n prefetch architecture with an interface designed to transfer four data words per clock cycle at the DQs. A single read or write access for the DDR-II SDRAM effectively consists of a single 4n bit wide, one clock cycle data transfer at the internal memory array and four corresponding n bit wide, one quarter clock cycle data transfers at the DQs. In one embodiment, random access memory 10 is a DDR-II SDRAM.

The next generation of DDR SDRAM after DDR-II SDRAM is DDR-III SDRAM. The DDR-III SDRAM architecture is essentially a 4n prefetch architecture with an interface designed to transfer four data words for every two clock cycles at the DQs. A single read or write access for the DDR-III SDRAM effectively consists of a single 4n bit wide, one clock cycle data transfer at the internal memory array and four corresponding n bit wide, half clock cycle data transfers at the DQs. In one embodiment, random access memory 10 is a DDR-III SDRAM.

Figure 3:
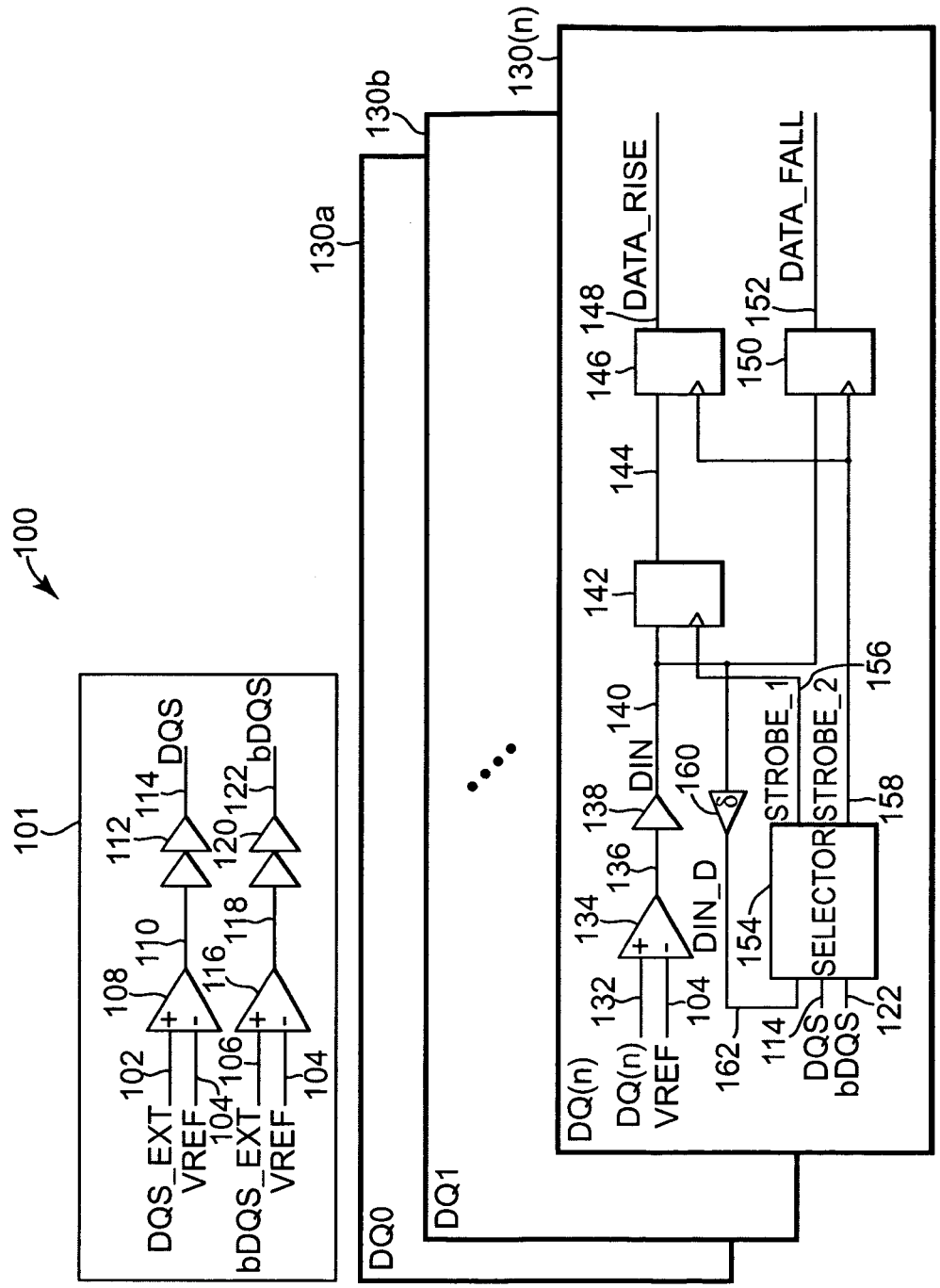
FIG. 3 is a diagram illustrating one embodiment of a circuit of the random access memory for latching input data into the random access memory.

FIG. 3 is a diagram illustrating one embodiment of a circuit 100 of DRAM 10 for latching input data into DRAM 10. In one embodiment, circuit 100 is part of data in/out circuit 46. Circuit 100 includes DQS receiver circuit 101 and data input circuits DQ0 130a through DQ(n) 130(n), where n equals the number of DQs for DRAM 10. In one embodiment, n equals 8, 16, 32, 64, or other suitable number of DQs. DQS receiver circuit 101 includes receivers 108 and 116 and buffers 112 and 120. The positive input of receiver 108 receives the DQS_EXT signal on DQS_EXT signal path 102. The negative input of receiver 108 receives the reference voltage (VREF) signal on VREF signal path 104. The output of receiver 108 is electrically coupled to the input of buffer 112 through signal path 110. The output of buffer 112 provides the data strobe (DQS) signal on DQS signal path 114.

The positive input of receiver 116 receives the inverted DQS external (bDQS_EXT) signal on bDQS_EXT signal path 106. The negative input of receiver 116 receives the VREF signal on VREF signal path 104. The output of receiver 116 is electrically coupled to the input of buffer 120 through signal path 118. The output of buffer 120 provides the inverted DQS (bDQS) signal on bDQS signal path 122. In one embodiment, the DQS_EXT signal and the bDQS_EXT signal are provided by memory controller 20 through communication link 22.

Receiver 108 outputs a logic high signal on signal path 110 in response to the voltage of the DQS_EXT signal on DQS_EXT signal path 102 rising above the voltage of the VREF signal on VREF signal path 104. Receiver 108 outputs a logic low signal on signal path 110 in response to the voltage of the DQS_EXT signal falling below the voltage of the VREF signal. Buffer 112 buffers the signal on signal path 110 to provide the DQS signal on DQS signal path 114.

Receiver 116 provides a logic high signal on signal path 118 in response to the voltage of the bDQS_EXT signal on bDQS_EXT signal path 106 rising above the voltage of the VREF signal on VREF signal path 104. Receiver 116 outputs a logic low signal on signal path 118 in response to the voltage of the bDQS_EXT signal falling below the voltage of the VREF signal. Buffer 120 buffers the signal on signal path 118 to provide the bDQS signal on bDQS signal path 122. Therefore, the DQS signal on DQS signal path 114 and the bDQS signal on bDQS signal path 122 are dependent on the VREF signal on VREF signal path 104 and receivers 108 and 116.

Data input circuits 130a–130(n) are similar and include components similar to the components illustrated in data input circuit DQ(n) 130(n). Data input circuit 130(n) includes receiver 134, buffer 138, delay 160, selector 154, and latches 142, 146, and 150. The positive input of receiver 134 receives the DQ(n) signal on DQ(n) signal path 132. The negative input of receiver 134 receives the VREF signal on VREF signal path 104. The output of receiver 134 is electrically coupled to the input of buffer 138 through signal path 136. The output of buffer 138 is electrically coupled to the data input of latch 142, the data input of latch 150, and the input of delay 160 through internal data (DIN) signal path 140.

The output of delay 160 is electrically coupled to a first input of selector 154 through delayed DIN (DIN_D) signal path 162. A second input of selector 154 receives the DQS signal from buffer 112 on DQS signal path 114. A third input of selector 154 receives the bDQS signal from buffer 120 on bDQS signal path 122. A first output of selector 154 is electrically coupled to the clock input of latch 142 through STROBE_1 signal path 156. A second output of selector 154 is electrically coupled to the clock inputs of latches 146 and 150 through STROBE_2 signal path 158. The output of latch 142 is electrically coupled to the data input of latch 146 through signal path 144. Latch 146 provides the rising edge data (DATA_RISE) signal on DATA_RISE signal path 148. Latch 150 provides the falling edge data (DATA_FALL) signal on DATA_FALL signal path 152. The DATA_RISE signal and the DATA_FALL signal are provided to other circuits within DRAM 10 to be written to array of memory cells 32.

Receiver 134 provides a logic high signal on signal path 136 in response to the voltage of the DQ(n) signal on DQ(n) signal path 132 rising above the voltage of the VREF signal on VREF signal path 104. Receiver 134 outputs a logic low signal on signal path 136 in response to the voltage of the DQ(n) signal falling below the voltage of the VREF signal. Buffer 138 buffers the signal on signal path 136 to provide the DIN signal on DIN signal path 140. Delay 160 delays the DIN signal on DIN signal path 140 to provide the DIN_D signal on DIN_D signal path 162.

Selector 154 receives the DIN_D signal on DIN_D signal path 162, the DQS signal on DQS signal path 114, and the bDQS signal on bDQS signal path 122 and provides the STROBE_1 signal on STROBE_1 signal path 156 and the STROBE_2 signal on STROBE_2 signal path 158. Selector 154 provides the STROBE_1 signal and the STROBE_2 signal based on the values of the DIN_D signal, the DQS signal, and the bDQS signal.

Latch 142 receives the DIN signal on DIN signal path 140 and the STROBE_1 signal on STROBE_1 signal path 156. In response to a logic high STROBE_1 signal, latch 142 latches the DIN signal to provide the signal on signal path 144. Latch 146 receives the signal on signal path 144 and the STROBE_2 signal on STROBE_2 signal path 158. In response to a logic high STROBE_2 signal, latch 146 latches the signal on signal path 144 to provide the DATA_RISE signal on DATA_RISE signal path 148. Latch 150 receives the DIN signal on DIN signal path 140, and the STROBE_2 signal on STROBE_2 signal path 158. In response to a logic high STROBE_2 signal, latch 152 latches the DIN signal, to provide the DATA_FALL signal on DATA_FALL signal path 152.

Figure 4:
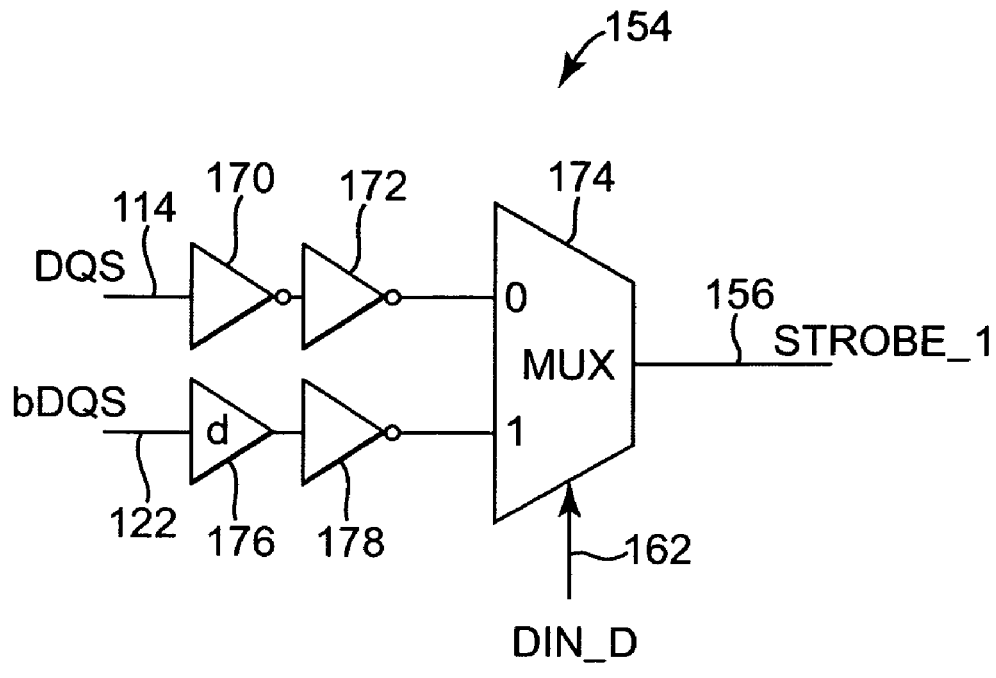
FIG. 4 is a diagram illustrating one embodiment of a selector for generating strobe signals for latching data into the random access memory.
Figure 4:
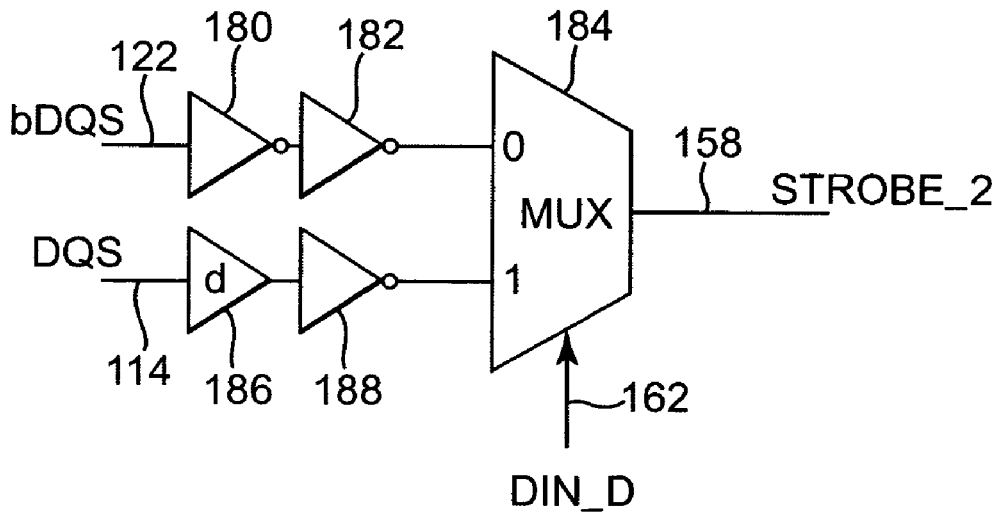

FIG. 4 is a diagram illustrating one embodiment of selector 154. Selector 154 includes multiplexers 174 and 184, inverters 170, 172, 178, 180, 182, and 188, and delays 176 and 186. The input of inverter 170 receives the DQS signal on DQS signal path 114. The output of inverter 170 is electrically coupled to the input of inverter 172. The output of inverter 172 is electrically coupled to input zero of multiplexer 174. The input of delay 176 receives the bDQS signal on bDQS signal path 122. The output of delay 176 is electrically coupled to the input of inverter 178. The output of inverter 178 is electrically coupled to input one of multiplexer 174. The selector input of multiplexer 174 receives the DIN_D signal on DIN_D signal path 162. The output of multiplexer 174 provides the STROBE_1 signal on STROBE_1 signal path 156.

Inverter 180 receives the bDQS signal on bDQS signal path 122. The output of inverter 180 is electrically coupled to the input of inverter 182. The output of inverter 182 is electrically coupled to input zero of multiplexer 184. The input of delay 186 receives the DQS signal on DQS signal path 114. The output of delay 186 is electrically coupled to the input of inverter 188. The output of inverter 188 is electrically coupled to input one of multiplexer 184. The selector input of multiplexer 184 receives the DIN_D signal on DIN_D signal path 162. The output of multiplexer 184 provides the STROBE_2 signal on STROBE_2 signal path 158.

In response to a logic low DINED signal on DIN_D signal path 162, multiplexer 174 provides the STROBE_1 signal by passing the signal at input zero of multiplexer 174. The signal at input zero of multiplexer 174 is the DQS signal inverted by inverters 170 and 172. In response to a logic high DIN_D signal, multiplexer 174 provides the STROBE_1 signal by passing the signal at input one of multiplexer 174. The signal at input one of multiplexer 174 is the bDQS signal delayed by delay 176 and inverted by inverter 178. In one embodiment, the delay of a signal through delay 176 is equal to the delay of a signal through inverter 170.

In response to a logic low DIN_D signal on DIN_D signal path 162, multiplexer 184 provides the STROBE_2 signal by passing the signal at input zero of multiplexer 184. The signal at input zero of multiplexer 184 is the bDQS signal inverted by inverters 180 and 182. In response to a logic high DIN_D signal, multiplexer 184 provides the STROBE_2 signal by passing the signal at input one of multiplexer 184. The signal at input one of multiplexer 184 is the DQS signal delayed by delay 186 and inverted by inverter 188. In one embodiment, the delay of a signal through delay 186 is equal to the delay of a signal through inverter 180.

In operation, DQS receiver circuit 101 receives the DQS_EXT signal and the bDQS_EXT signal and provides the DQS signal and the bDQS signal used by data input circuits DQ0 130a through DQ(n) 130(n). For each data input circuit 130a–130(n), receiver 134 receives the DQ signal and provides a data signal, which is buffered by buffer 138 to provide the DIN signal. The DIN signal is delayed by delay 160 to provide the DIN_D signal, which is received by selector 154. Selector 154 also receives the DQS signal and the bDQS signal, and based on the DIN_D signal, the DQS signal, and the bDQS signal, provides the STROBE_1 signal and the STROBE_2 signal.

The STROBE_1 signal is provided to latch 142 to latch rising edge data of the DIN signal. The STROBE_2 signal is provided to latch 150 to latch falling edge data of the DIN signal, and to latch 146 for passing the rising edge data of the DIN signal latched in latch 142 to latch 146. The edge of the DQS signal or the bDQS signal used to generate the STROBE_1 signal and the STROBE_2 signal matches the rising edge or falling edge of the DIN signal. Therefore, variations in the VREF signal that may affect the propagation delay of receivers 108, 116, and 134 do not affect the setup and hold times of the DQs.

FIGS. 5A–5D are timing diagrams 200A–200D, respectively, illustrating one embodiment of the timing of signals for circuit 100. Timing diagrams 200A–200D include DIN signal 202 on DIN signal path 140, DIN_D signal 204 on DIN_D signal path 162, DQS signal 206 on DQS signal path 114, bDQS signal 208 on bDQS signal path 122, STROBE_1 signal 210 on STROBE_1 signal path 156, and STROBE_2 signal 212 on STROBE_2 signal path 158.

Figure 5A:
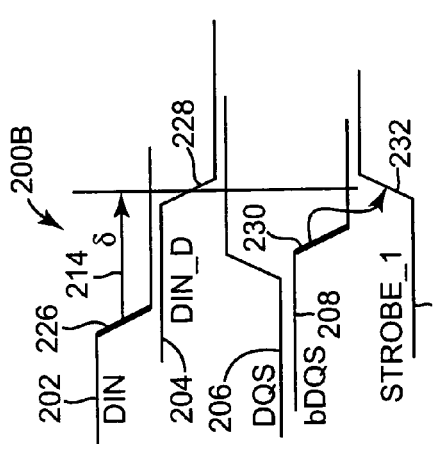
FIG. 5A is a timing diagram illustrating one embodiment of the timing of signals for latching in rising edge data if the data is transitioning from logic low to logic high.

FIG. 5A is a timing diagram 200A illustrating one embodiment of the timing of signals for latching in rising edge data if the data is transitioning from logic low to logic high. Rising edge 216 of DIN signal 202 is delayed by delay 160 as indicated at 214 to provide rising edge 218 of DIN_D signal 204. In response to a logic low DIN_D signal 204 before rising edge 218, multiplexer 174 provides rising edge 222 of STROBE_1 signal 210 in response to rising edge 220 of DQS signal 206. In response to rising edge 222 of STROBE_1 signal 210, the logic high DIN signal 202 is latched by latch 142.

Figure 5B:
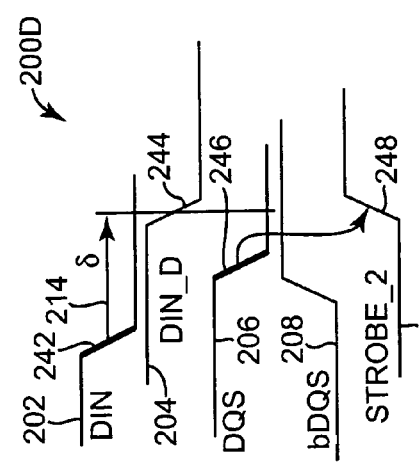
FIG. 5B is a timing diagram illustrating one embodiment of the timing of signals for latching in rising edge data if the data is transitioning from logic high to logic low.

FIG. 5B is a timing diagram 200B illustrating one embodiment of the timing of signals for latching in rising edge data if the data is transitioning from logic high to logic low. Falling edge 226 of DIN signal 202 is delayed by delay 160 as indicated at 214 to provide falling edge 228 of DIN_D signal 204. In response to a logic high DIN_D signal 204 before falling edge 228, multiplexer 174 provides rising edge 232 of STROBE_1 signal 210 in response to falling edge 230 of bDQS signal 208. In response to rising edge 232 of STROBE_1 signal 210, the logic low DIN signal 202 is latched by latch 142.

Figure 5C:
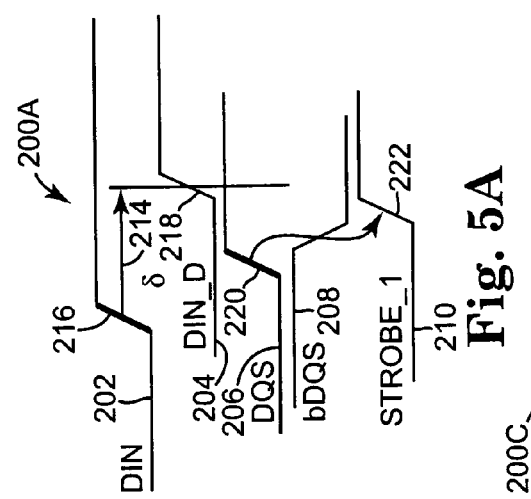
FIG. 5C is a timing diagram illustrating one embodiment of the timing of signals for latching in falling edge data if the data is transitioning from logic low to logic high.

FIG. 5C is a timing diagram 200C illustrating one embodiment of the timing of signals for latching in falling edge data if the data is transitioning from logic low to logic high. Rising edge 234 of DIN signal 202 is delayed by delay 160 as indicated at 214 to provide rising edge 236 of DIN_D signal 204. In response to a logic low DIN_D signal 204 before rising edge 236, multiplexer 184 provides rising edge 240 of STROBE_2 signal 212 in response to rising edge 238 of bDQS signal 208. In response to rising edge 240 of STROBE_2 signal 212, the logic high DIN signal 202 is latched by latch 150.

Figure 5D:
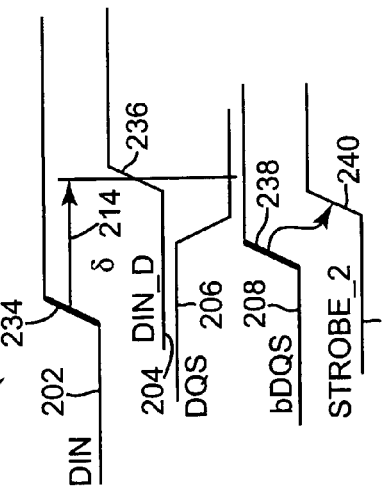
FIG. 5D is a timing diagram illustrating one embodiment of the timing of signals for latching in falling edge data if the data is transitioning from logic high to logic low.

FIG. 5D is a timing diagram 200D illustrating one embodiment of the timing of signals for latching in falling edge data if the data is transitioning from logic high to logic low. Falling edge 242 of DIN signal 202 is delayed by delay 160 as indicated at 214 to provide falling edge 244 of DIN_D signal 204. In response to a logic high DIN_D signal 204 before falling edge 244, multiplexer 184 provides rising edge 248 of STROBE_2 signal 212 in response to falling edge 246 of DQS signal 206. In response to rising edge 248 of STROBE_2 signal 212, the logic low DIN signal 202 is latched by latch 150.

Embodiments of the present invention match the edge of the DQS signal or bDQS signal to the edge of the input data to be latched into the memory. Data transitioning from logic low to logic high is matched to a rising edge of the DQS signal or bDQS signal, and data transitioning from logic high to logic low is matched to a falling edge of the DQS signal or bDQS signal. Therefore, any variations of the VREF signal do not affect the setup and hold times of the DQs.

What is claimed is:

1. A circuit for latching data into a memory comprising:
   a receiver configured for receiving a data signal;
   a delay configured to delay the data signal to provide a delayed data signal; and
   a selector configured to receive the delayed data signal, a data strobe signal, and an inverted data strobe signal and provide a first strobe signal and a second strobe signal in response to the delayed data signal, the data strobe signal, and the inverted data strobe signal,
   wherein rising edge data is latched into the memory in response to the first strobe signal and falling edge data is latched into the memory in response to the second strobe signal.

2. The circuit of claim 1, wherein the selector comprises:
   a first multiplexer configured to provide the first strobe signal in response to a rising edge of the data strobe signal and a logic low delayed data signal, and provide the first strobe signal in response to a falling edge of the inverted data strobe signal and a logic high delayed data signal.

3. The circuit of claim 2, wherein the selector comprises:
   a second multiplexer configured to provide the second strobe signal in response to a rising edge of the inverted data strobe signal and a logic low delayed data signal, and provide the second strobe signal in response to a falling edge of the data strobe signal and a logic high delayed data signal.

4. A circuit for writing data to a memory comprising:
   a selector configured to receive a delayed data signal, a data strobe signal, and an inverted data strobe signal, the selector configured to:
   provide a first strobe signal for latching a logic high data signal in response to a rising edge of the data strobe signal and a logic low delayed data signal;

provide the first strobe signal for latching a logic low data signal in response to a falling edge of the inverted data strobe signal and a logic high delayed data signal;
provide a second strobe signal for latching a logic high data signal in response to a rising edge of the inverted data strobe signal and a logic low delayed data signal; and
provide the second strobe signal for latching a logic low data signal in response to a falling edge of the data strobe signal and a logic high delayed data signal.

5. The circuit of claim 4, further comprising:
a first latch configured to latch the data signal in response to the first strobe signal to provide rising edge data; and
a second latch configured to latch the data signal in response to the second strobe signal to provide falling edge data.

6. A memory comprising:
a data in/out circuit comprising:
   a first receiver configured to provide a data strobe signal in response to an external data strobe signal;
   a second receiver configured to provide an inverted data strobe signal in response to an external inverted data strobe signal;
   a third receiver configured to provide a data signal in response to an external data signal;
   a delay configured to delay the data signal to provide a delayed data signal;
   a selector configured to provide a first strobe signal and a second strobe signal in response to the data strobe signal, the inverted data strobe signal, and the delayed data signal;
   a first latch configured to latch the data signal in response to the first strobe signal to provide a rising edge data signal; and
   a second latch configured to latch the data signal in response to the second strobe signal to provide a falling edge data signal.

7. The memory of claim 6, wherein the data in/out circuit further comprises a third latch configured to latch the rising edge data signal in response to the second strobe signal.

8. The memory of claim 6, wherein the first receiver is configured to provide the data strobe signal by comparing the external data strobe signal to a reference voltage, wherein the second receiver is configured to provide the inverted data strobe signal by comparing the external inverted data strobe signal to the reference voltage, and wherein the third receiver is configured to provide the data signal by comparing the external data signal to the reference voltage.

9. The memory of claim 6, wherein the selector is configured to provide the first strobe signal in response to a rising edge of the data strobe signal and a logic low delayed data signal.

10. The memory of claim 6, wherein the selector is configured to provide the first strobe signal in response to a falling edge of the inverted data strobe signal and a logic high delayed data signal.

11. The memory of claim 6, wherein the selector is configured to provide the second strobe signal in response to a rising edge of the inverted data strobe signal and a logic low delayed data signal.

12. The memory of claim 6, wherein the selector is configured to provide the second strobe signal in response to a falling edge of the data strobe signal and a logic high delayed data signal.

13. The memory of claim 6, further comprising:
a memory controller configured to provide the external data strobe signal and the external inverted data strobe signal; and
an array of memory cells coupled to the data in/out circuit.

14. The memory of claim 13, wherein the memory controller, the data in/out circuit, and the array of memory cells are configured as a dynamic random access memory.

15. A circuit for latching data into a memory comprising:
means for latching a logic high data signal into the memory in response to a rising edge of a data strobe signal and a logic low delayed data signal;
means for latching a logic low data signal into the memory in response to a falling edge of an inverted data strobe signal and a logic high delayed data signal;
means for latching a logic high data signal into the memory in response to a rising edge of the inverted data strobe signal and a logic low delayed data signal; and
means for latching a logic low data signal into the memory in response to a falling edge of the data strobe signal and a logic high delayed data signal.

16. A method of latching data into a memory, the method comprising:
latching a logic high rising edge data signal into the memory in response to a rising edge of a data strobe signal;
latching a logic low rising edge data signal into the memory in response to a falling edge of an inverted data strobe signal;
latching a logic high falling edge data signal into the memory in response to a rising edge of the inverted data strobe signal; and
latching a logic low falling edge data signal into the memory in response to a falling edge of the data strobe signal.

17. The method of claim 16, wherein latching the logic high rising edge data signal into the memory comprises:
generating a first strobe signal in response to the rising edge of the data strobe signal and a logic low delayed rising edge data signal; and
latching the logic high rising edge data signal in response to the first strobe signal.

18. The method of claim 17, wherein latching the logic low rising edge data signal into the memory comprises:
generating the first strobe signal in response to the falling edge of the inverted data strobe signal and a logic high delayed rising edge data signal; and
latching the logic low rising edge data signal in response to the first strobe signal.

19. The method of claim 18, wherein latching the logic high falling edge data signal into the memory comprises:
generating a second strobe signal in response to the rising edge of the inverted data strobe signal and a logic low delayed falling edge data signal; and
latching the logic high falling edge data signal in response to the second strobe signal.

20. The method of claim 19, wherein latching the logic low falling edge data signal into the memory comprises:
generating the second strobe signal in response to the falling edge of the data strobe signal and a logic high delayed falling edge data signal; and
latching the logic low falling edge data signal in response to the second strobe signal.

21. A method for receiving data into a memory, the method comprising:
receiving a data signal, a data strobe signal, and an inverted data strobe signal;

delaying the data signal to provide a delayed data signal;
providing a first strobe signal for latching a logic high data signal in response to a rising edge of the data strobe signal and a logic low delayed data signal;
providing the first strobe signal for latching a logic low data signal in response to a falling edge of the inverted data strobe signal and a logic high delayed data signal;
providing a second strobe signal for latching a logic high data signal in response to a rising edge of the inverted data strobe signal and a logic low delayed data signal; and
providing the second strobe signal for latching a logic low data signal in response to a falling edge of the data strobe signal and a logic high delayed data signal.

22. The method of claim 21, further comprising:
latching the data signal in response to the first strobe signal in a first latch; and
latching the data signal in response to the second strobe signal in a second latch.

23. The method of claim 22, wherein latching the data signal in response to the first strobe signal comprises latching rising edge data in the first latch.

24. The method of claim 22, wherein latching the data signal in response to the second strobe signal comprises latching falling edge data in the second latch.

25. A method for writing to a memory, the method comprising:
receiving an external data strobe signal;
receiving an external inverted data strobe signal;
receiving an external data signal;
comparing the external data strobe signal to a reference voltage to provide a data strobe signal;
comparing the external inverted data strobe signal to the reference voltage to provide an inverted data strobe signal;
comparing the external data signal to the reference voltage to provide a data signal;
generating a first strobe signal and a second strobe signal in response to the data strobe signal, the inverted data strobe signal, and the data signal;
latching the data signal in response to the first strobe signal to provide a rising edge data signal; and
latching the data signal in response to the second strobe signal to provide a falling edge data signal.

26. The method of claim 25, wherein generating the first strobe signal comprises generating the first strobe signal in response a rising edge of the data strobe signal and a logic low delayed data signal.

27. The method of claim 25, wherein generating the first strobe signal comprises generating the first strobe signal in response to a falling edge of the inverted data strobe signal and a logic high delayed data signal.

28. The method of claim 25, wherein generating the second strobe signal comprises generating the second strobe signal in response a rising edge of the inverted data strobe signal and a logic low delayed data signal.

29. The method of claim 25, wherein generating the second strobe signal comprises generating the second strobe signal in response to a falling edge of the data strobe signal and a logic high delayed data signal.

* * * * *